United States Patent
Ogawa

[11] Patent Number: 5,406,567
[45] Date of Patent: Apr. 11, 1995

[54] OFF-LINE TEST CIRCUIT OF A SEMICONNECTOR INTEGRATED LOGIC CIRCUIT

[75] Inventor: Tadahiko Ogawa, Tokyo, Japan
[73] Assignee: NEC Corporation, Tokyo, Japan
[21] Appl. No.: 75,798
[22] Filed: Jun. 14, 1993

[30] Foreign Application Priority Data
Jun. 12, 1992 [JP] Japan .................. 4-153762

[51] Int. Cl.⁶ .......................................... H04B 17/00
[52] U.S. Cl. ................... 371/22.1; 371/22.3; 371/22.5; 371/25.1
[58] Field of Search .............. 371/22.1, 22.3, 22.5, 371/25.1

[56] References Cited
U.S. PATENT DOCUMENTS

| | | | |
|---|---|---|---|
| 4,602,210 | 7/1986 | Fasang et al. | 324/73 R |
| 4,918,379 | 4/1990 | Jongepier | 371/25.1 |
| 5,115,435 | 5/1992 | Langfond, II et al. | 371/22.1 |
| 5,166,937 | 11/1992 | Blecha, Jr. | 371/22.5 |
| 5,198,758 | 3/1993 | Iknaian et al. | 371/22.1 |
| 5,226,047 | 7/1993 | Catlin | 371/16.2 |
| 5,260,948 | 11/1993 | Simpson et al. | 371/22.3 |

Primary Examiner—Emanuel T. Voeltz
Assistant Examiner—Hal D. Wachsman
Attorney, Agent, or Firm—Sughrue, Mion, Zinn, Macpeak & Seas

[57] ABSTRACT

In a semiconductor integrated logic circuit, latch circuits are provided to hold the input signal supplied to a random logic circuit just before an operation mode is switched from a normal operation mode to a test operation mode. During the test operation mode, the latched signals are continued to be supplied to random logic circuit so that the operation condition of a internal circuit of the random logic circuit is maintained as it is. Therefore, when the circuit is returned from the test operation mode to the normal operation mode, the circuit operation of the internal circuit of the random logic circuit continuing from the circuit operation in the previous normal operation condition can be obtained.

2 Claims, 2 Drawing Sheets

OFF-LINE TEST CIRCUIT OF A SEMICONNECTOR INTEGRATED LOGIC CIRCUIT

BACKGROUND OF THE INVENTION

1. Field of the Invention

The present invention relates to an off-line test circuit of a semiconductor integrated logic circuit. More particularly, the present invention relates to an off-line circuit of a functional macro circuit such as an ALU(Arithmetic & Logic Unit) or a RAM(Random Access Memory), embedded in the semiconductor integrated logic circuit.

2. Description of Related Art

In conventional semiconductor integrated logic circuits, a functional macro circuit is integrated together with a random logic circuit on the same semiconductor substrate. In the case of testing the functional macro circuit, an off-line test circuit for testing the functional macro circuit independently of the random logic circuit, is generally added in order to reduce the effort for generating the test vector.

Namely, it is possible to bring the semiconductor integrated logic circuit either in a usual operation mode (a mode when the semiconductor integrated logic circuit chip is packaged) or in a test operation mode, by controlling a signal given to an external test mode setting input pin. For example, if a signal "L" is given on the external test mode setting input pin, the circuit is brought into the normal operation mode, and if a signal "H" is given, the circuit is brought into the test operation mode, so that a functional macro circuit can be independently tested.

In the normal operation mode, for example, signals given to external input pins are applied to a random logic circuit, while an output signal of the random logic circuit can be outputted from the external output pin. Furthermore, an output signal of the functional macro circuit is supplied to a random logic circuit through a buffer circuit, and an output signal of the random logic circuit is alternatively inputted to the functional macro circuit through a selection circuit. Thus, the signals are exchanged between the random logic circuit and the functional macro circuit.

In the test operation mode, on the other hand, a signal given to the external input pin is applied through the buffer circuits and through the selection circuit selectively to the functional macro circuit. An output signal of the functional macro circuit is passed through the buffer circuit and selectively outputted from the external output pin through the selection circuit.

As mentioned above, in the test operation mode, the functional macro circuit can be directly tested through the external input pin and the external output pin from the exterior of the semiconductor circuit chip, independently of the random logic circuit, and the external pin used only for the test is only the test mode setting external input pin for receiving a test mode setting signal.

In this way, it is made possible by controlling the test mode setting signal, that in the test operation mode, only a test vector for testing only the functional macro circuit should be considered, and in the normal operation mode, it is not required to consider the testing of the functional macro circuit and it is sufficient if only the test vector for testing only the random logic circuit is considered. Thus, even if the scale of the random logic circuit increases or if the logic becomes more complicate, it is possible to reduce the effort of generating the test vector, because it is not required to test the functional macro circuit through the random logic circuit.

However, in such a conventional example of the semiconductor integrated logic circuit, the functional macro circuit can be directly accessed from the exterior of the semiconductor integrated circuit chip, not through the random logic circuit, by giving a signal to the external input pin in the test operation mode. However, the signal is simultaneously applied to the random logic circuit through the buffer circuits. This may cause an internal circuit of the random logic circuit to operate in the course of the test operation mode.

Further, the output signal of the functional macro circuit is inputted to the random logic circuit through the buffer circuit in the course of the test operation mode. This may also cause the internal circuit of the random logic circuit to operate in the course of the test operation mode.

These factors cause the following problems:

1) The internal condition of the random logic circuit immediately after the test operation mode is completed and the circuit is returned to the normal operation mode, is different from that of the random logic circuit just before the circuit is brought into the test operation mode.

Consequently, if the test operation mode is effected in the course of the normal operation mode, the normal operation mode cannot be tested successively. Thus, it is necessary to initialize the circuit each time the test operation mode is finished, and to test the normal operation mode from the beginning.

2) In the case that the random logic circuit supplies and receives signals through an external bidirectional pin and also controls a signal for switching the signal inputting/outputting condition of the external bidirectional pin, the signal inputting/outputting condition of this external bidirectional pin cannot be expected in the course of the test operation mode. Consequently, the switching between a driver and a comparator in a LSI (large scaled integrated circuit) tester connected to this bidirectional pin cannot be effected in the course of the test operation mode. Thus, it causes inconsistency between the LSI tester and the signal inputting-/outputting condition of the external bidirectional pin of the semiconductor circuit chip, which may destroy the semiconductor circuit chip itself.

3) As a result of an unexpected circuit operation of the random logic circuit in the course of the test operation mode, in the case that a buffer circuit for the output interface connected to the random logic circuit outputs the identical signals simultaneously, a large amount of current may flow in a voltage supply simultaneously. This large amount of current causes noise, so that the voltage level of the voltage supply varies, which affects the test of the functional macro circuit in the test operation mode, namely, it may cause malfunction.

SUMMARY OF THE INVENTION

Accordingly, it is an object of the present invention to provide a semiconductor integrated logic circuit which has overcome the above mentioned defect of the conventional one.

Another object of the present invention is to provide a semiconductor integrated logic circuit which permits it to obtain an operation condition of the internal circuit of the random logic circuit continuing from the circuit operation of a previous normal operation condition when the circuit is returned from the test operation mode to the normal operation mode, which has no risk destroying the semiconductor chip itself by the inconsistency between the tester and the external signal inputting/outputting condition of the semiconductor circuit chip, and which is capable of preventing malfunction of the functional macro circuit in the course of the test operation, which would be otherwise caused by the simultaneous output operation of the buffer circuit for the output interface.

The above and other objects of the present invention are achieved in accordance with the present invention by a semiconductor integrated logic circuit comprising a functional macro circuit as an off-line test unit, a plurality of external input pins, a plurality of external output pins, a random logic circuit receiving signals from the plurality of external input pins and for outputting output signals from the plurality of external output pins, a test operation mode setting input pin receiving an off-line test mode setting signal, a first supply circuit for supplying a signal from one of the plurality of external input pins to the random logic circuit, a second supply circuit for supplying an output signal from the functional macro circuit to the random logic circuit, a first selection circuit for selecting either the signal of the one of the plurality of external input pins or an output signal of the random logic circuit in accordance with the mode setting signal, so as to output the selected signal to the functional macro circuit, and a second selection circuit for selecting either an output signal of the functional macro circuit or an output signal of the random logic circuit in accordance with the mode setting signal, so as to output the selected signal to one of the plurality of external output pins, characterized in that the first supply circuit and the second supply circuit include a holding circuit for holding the operation mode of an internal circuit in the random logic circuit in a condition just before the mode switching in the case that the test operation mode is made valid in accordance the mode setting signal.

In one embodiment, the holding circuit comprises a latch circuit for holding an input signal just before the mode switching in the case that the test operation mode is made valid in accordance the mode setting signal.

In another embodiment, the holding circuit of the first supply circuit comprises a first two-input OR gate for supplying a logical sum between the output signal of the one of the plurality of external input pins and the signal of the test operation mode setting pin, to the random logic circuit, and wherein the holding circuit of the second supply circuit comprises a second two-input OR gate for supplying a logical sum between the output signal of the functional macro circuit and the signal of the test mode setting input pin, to the random logic circuit.

With the above mentioned arrangement, the holding circuit of the first and second supply circuits hold the operation mode of the internal circuit in the random logic circuit in a condition just before the mode switching in the case that the test operation mode is valid in accordance the mode setting signal.

Accordingly, it is possible to obtain the circuit operation of the internal circuit of the random logic circuit continuing from the circuit operation of a previous normal operation condition when the circuit returns from the test operation mode to the normal operation mode. Therefore, there is no risk in which the semiconductor chip itself is destroyed by the inconsistency between the tester and the external signal inputting/outputting condition of the semiconductor circuit chip, and it is possible to prevent malfunction of the functional macro circuit in the course of the test operation, which would be otherwise caused by the simultaneous output operation of the buffer circuit for the output interface.

The above and other objects, features and advantages of the present invention will be apparent from the following description of preferred embodiments of the invention with reference to the accompanying drawings.

DESCRIPTION OF THE PREFERRED EMBODIMENTS

Figure 1:
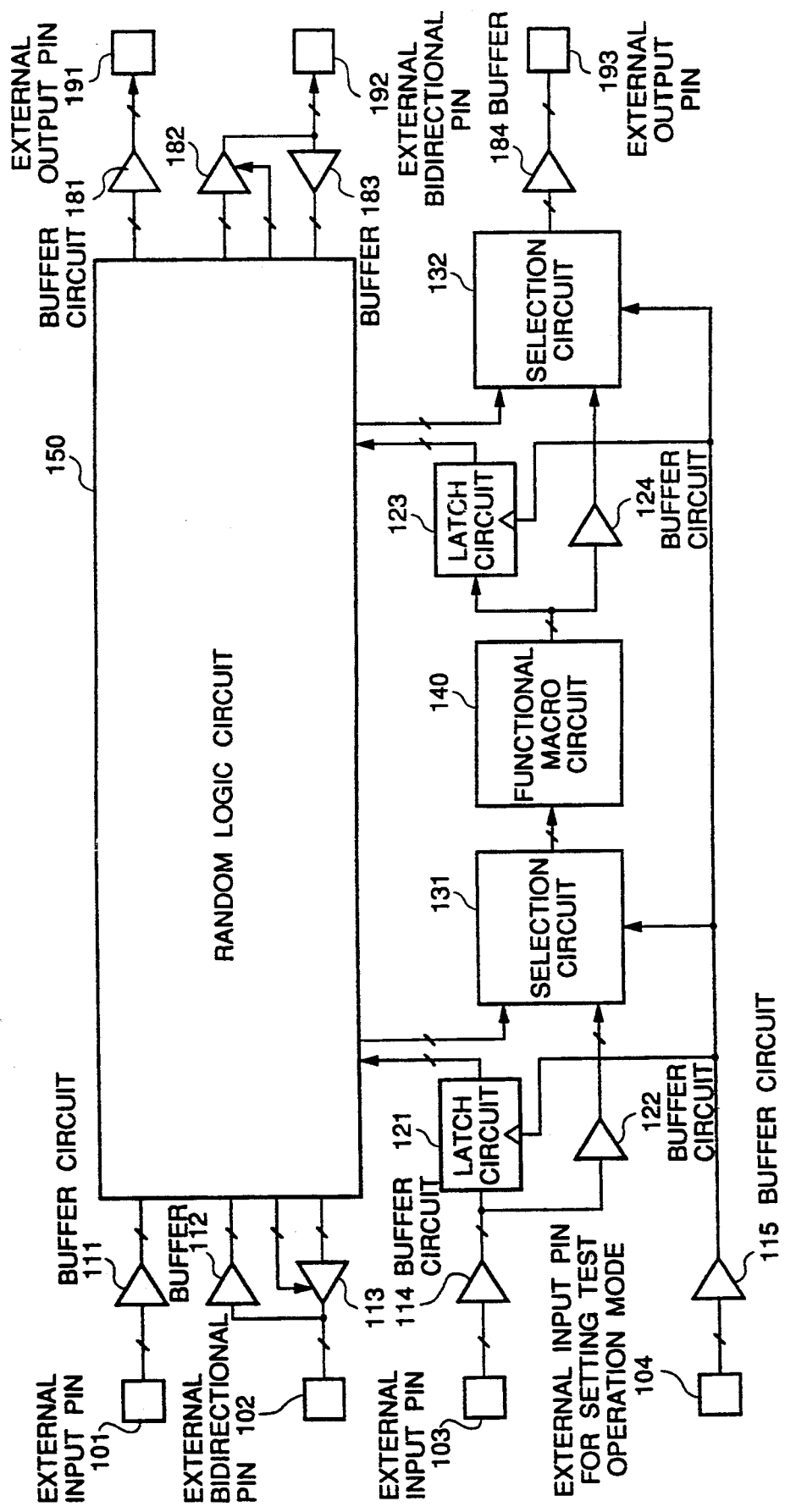
FIG. 1 is a block diagram of one embodiment of the semiconductor integrated logic circuit in accordance with the present invention.

Referring to FIG. 1, there is shown a diagram of

Embodiments of the present invention will be explained with reference to the drawings. FIG. 1 is a block diagram of an embodiment of the semiconductor integrated logic circuit in accordance with the present invention.

In FIG. 1, the shown semiconductor integrated logic circuit includes a functional macro circuit 140 as an off-line test unit, a plurality of external input pins 101 and 103, buffer circuits 111 and 114 for an input interface, connected to the external input pins 101 and 103, respectively, and a buffer circuit 122 connected to the buffer circuit 114. The shown semiconductor integrated logic circuit also includes a plurality of external output pins 191 and 193, buffer circuits 181 and 184 for an output interface, connected to the external output pins 191 and 193, respectively, a random logic circuit 150 which receives signals from the external input pins 101 and 103 and supplies output signals through the buffer circuits 181 and 184 from the external output pins 191 and 193. In addition, the shown semiconductor integrated logic circuit includes an external input pin 104 as a test operation mode setting input pin for receiving a mode setting signal for the off-line test, a buffer circuit 115 for the input interface, connected to the external input pin 104, a first supply circuit which receives a signal from one of the plurality of external input pins 103 through the buffer circuit 114 and supplies the received signal to the random logic circuit 150, and a second supply circuit for supplying an output signal of the functional macro circuit 140 to the random logic circuit 150. Furthermore, the shown semiconductor integrated logic circuit includes a selection circuit 131 as a first selection circuit which receives the signal from the external input pin 103 through the buffer circuits 114 and 122 and also receives an output signal of the random logic circuit 150. The selection circuit 131 selects the output signal of the random logic circuit 150 so as to supply the output signal of the random logic circuit 150 to the functional macro circuit 140, when the mode setting signal indicates that the normal operation mode is valid. The selection circuit 131 selects the signal of the external input pin 103 and output, the signal of the external input pin 103 to the functional macro circuit 140 when the mode setting signal indicates that the test operation mode is valid. The shown semiconductor integrated logic circuit also includes a selection circuit 132 as a second selection circuit which receives an output signal of the functional macro circuit through a buffer circuit 124 and also receives an output signal of the random logic circuit 150. The selection circuit 132 selects the output signal of the random logic circuit 150 and outputs the output signal of the random logic circuit 150 to the external output pin 193 through the buffer circuit 184 when the mode setting signal indicates that the normal operation mode is valid. The selection circuit 132 selects the output signal of the functional macro circuit 140 and outputs the output signal of the functional macro circuit 140 to the external input pin 193 when the mode setting signal indicates that the test operation mode is valid. Furthermore, the shown semiconductor integrated logic circuit includes an external bidirectional pin 102 connected to the random logic circuit 150 through a buffer circuit 112 for an input interface and through a buffer circuit 113 having an enable control for an output interface, and an external bidirectional pin 192 connected to the random logic circuit 150 through a buffer circuit 183 for an input interface and a buffer circuit 182 having an enable control for an output interface.

Thus, the present invention is characterized in that the first and second supply circuits comprise circuit for holding the operation condition of an internal circuit of the random logic circuit 150 just before the mode switching in the case that the test operation mode is made valid in accordance with the mode setting signal.

In the first embodiment shown in FIG. 1, the holding circuits comprise latch circuits 121 and 123, respectively, for holding the input signal just before the mode switching if the test operation mode is rendered valid in accordance with the mode setting signal.

Operation of the semiconductor integrated logic circuit having the above mentioned structure will be described as follows.

In FIG. 1, the mode can be set by inputting the test operation mode setting signal to the external input pin 104. For example, the normal operation mode is set if the test operation mode setting signal is at "L" (low logical level), while the test operation mode is set if the test operation mode setting signal is at "H" (high logical level).

At first, if a signal of "L" is applied to the test operation mode setting external input pin 104, the circuit is in the normal operation mode. The random logic circuit 150 receives the signal applied to the external input pin 101, and supplies an output signal to the external output pin 191.

In this case, the external bidirectional pins 102 and 192 become the external input pin or the external output pin in accordance with a signal inputting/outputting condition control signal outputted by the random logic circuit 150, so that a signal input or a signal output is performed for the random logic circuit 150.

Furthermore, in the normal operation mode, the latch circuit 121 and 123 are put in a pass-through condition by maintaining the test operation mode setting signal a "L". Consequently, the latch circuit 121 outputs the signal given to the external input pin 103, to the random logic circuit 150, while the latch circuit 123 outputs the output signal of the functional macro circuit 140 to the random logic circuit 150. The selection circuit 131 selects the output signal of the random logic circuit 150 so as to output the output signal of the random logic circuit 150 to the functional macro circuit 140, and on the other hand, the selection circuit 132 outputs the signal received from the random logic circuit 150, to the external output pin 193.

The circuit is switched from the normal operation mode to the test operation mode by bringing the test operation mode setting signal into "H". At this time, the latch circuits 121 and 123 are brought into a latching condition so as to latch the input signal in the final condition of the normal operation mode just before the mode switching, and to continue to output the latched signal to the random logic circuit 150 during the test operation mode.

Further, the external input pin 101 and the external pin(s) in the signal inputting condition of the external bidirectional pins 102 and 192, continue to receive, during the test operation mode, the final signal value in the normal operation mode just before the mode switching, so that the internal circuit of the random logic circuit 150 can hold the final condition of the normal operation mode just before the mode switching. In the course of the test operation mode, the selection circuit 131 selectively outputs the signal applied to the external input pin 103, to the functional macro circuit 140, and on the other hand, the selection circuit 132 selectively outputs the output signal of the functional macro circuit 140 to the external output pin 193. Accordingly, the functional macro circuit 140 can be independently and directly tested from the exterior of the semiconductor chip.

Thereafter, if the circuit is switched from the test operation mode to the normal operation mode by setting the test operation mode setting signal at "L", the latch circuits 121 and 123 are brought again into the pass-through condition. However, the latch circuits 121 and 123 latch the final signal of the normal operation mode which is just before the mode is switched to the test operation mode, namely, which is before one cycle. Accordingly, the internal circuit of the random logic circuit 150 maintains the final operation condition of the normal operation mode before one cycle, so that the test can be successively performed in the normal operation mode without discontinuing the operation.

Figure 2:
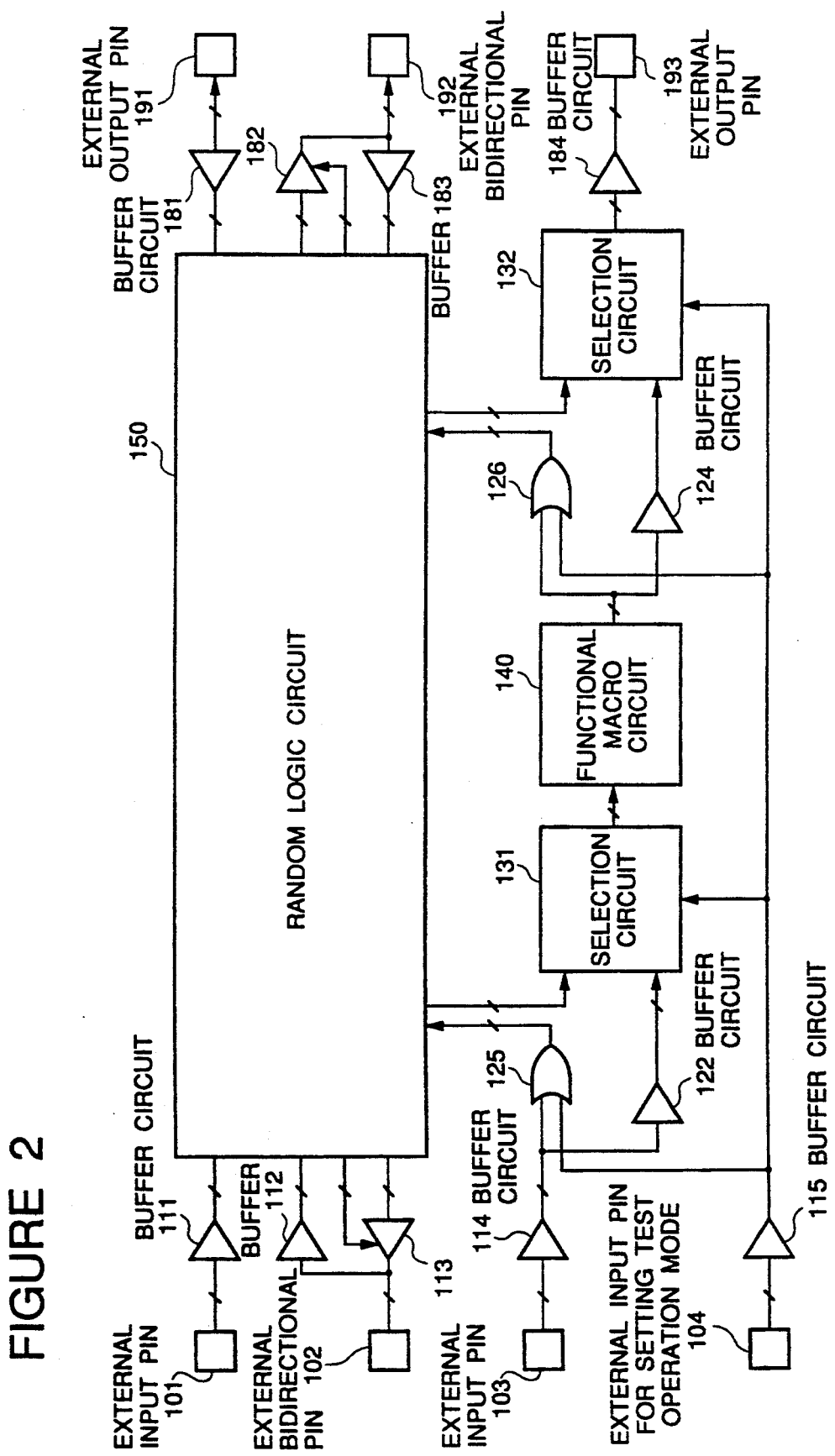
FIG. 2 is a block diagram of another embodiment of the semiconductor integrated logic circuit in accordance with the present invention.

FIG. 2 is a block diagram of another embodiment of the semiconductor integrated logic circuit in accordance with the present invention.

In FIG. 2, two-input OR gates 125 and 126 are used as holding circuits corresponding the latch circuits 121 and 123 in the above mentioned first embodiment, respectively.

Like the above mentioned first embodiment, the circuit is brought into the normal operation mode if the test operation mode setting signal is at "L", while it is brought into the test operation mode if the test operation mode setting signal is at "H". Therefore, in the normal operation mode, the two-input OR gates 125 and 126 output a signal given to the external input pin 103 and an output signal of the functional macro circuit 140 to the random logic circuit 150.

On the other hand, in the course of the test operation mode, each of the two-input OR gates 125 and 126 outputs a signal of "H", irrespectively of the signal given to the external input pin 103 and the output signal of the functional macro circuit 140. Thus, the random logic circuit 150 holds the condition of the internal circuit of the random logic circuit 150 in the course of the test operation mode. Therefore, it is possible to obtain the same effect as that of the above mentioned first embodiment. As mentioned above, if one and the same pin is used as an external pin for testing the functional macro circuit integrated on the semiconductor integrated logic circuit directly from the exterior and as an external pin for the access to the internal random logic circuit, all the signals applied to the internal random logic circuit can be held, during the period of the functional macro circuit test condition, at a value of the signals of the normal operation condition just before the circuit is brought into the functional macro circuit test condition. As a result, during the period of the functional macro circuit test condition, the internal logic circuit of the random logic circuit can be held in the condition of the internal circuit of the random logic circuit in the normal operation condition just before the circuit is brought into the functional macro circuit test condition. Accordingly, when the circuit is switched into the normal operation mode, it is possible to realize the circuit operation of the random logic circuit continuing from the circuit operation of the previous normal condition.

In addition, since the condition of the internal circuit of the random logic circuit is held in the course of testing the functional macro circuit, the signal inputting/outputting switching condition of the external bidirectional pin controlled by the random logic circuit is also held. Thus there happens no inconsistency with the setting of a comparator/driver of an external tester, so that there is no risk destroying the semiconductor chip itself. Similarly, since the internal circuit of the random logic circuit holds its internal condition, the output signal of the random logic circuit is also held. Therefore, the buffer circuit for the output interface receiving and outputting the output signals, never outputs the same signal at the same time. Consequently, there is no risk that a noise is generated at the voltage level of the voltage supply by the simultaneous output operation, which causes malfunction in the course of testing the functional macro circuit.

As mentioned above, according to the present invention, it is possible to obtain the circuit operation of the internal circuit of the random logic circuit continuing from the circuit operation in the previous normal operation condition when the circuit is returned from the test operation mode to the normal operation mode. Therefore, there is no risk of destroying the semiconductor chip itself by the inconsistency between the tester and the external signal inputting/outputting condition of the semiconductor circuit chip. Furthermore, it is possible to prevent the malfunction of the functional macro circuit caused by the output operation at the same time of the buffer circuit for the output interface.

The invention has thus been shown and described with reference to the specific embodiments. However, it should be noted that the present invention is in no way limited to the details of the illustrated structures but changes and modifications may be made within the scope of the appended claims.

I claim:

1. A semiconductor integrated logic circuit including:
    a functional macro circuit as an off-line test unit;
    first and second external input pins;
    first and second buffer circuits for an input interface, connected to said first and second external input pins, respectively;
    a third buffer circuit connected to said second buffer circuit;
    first and second external output pins;
    fourth and fifth buffer circuits for an output interface, connected to said first and second external output pins, respectively;
    a random logic circuit which receives signals from said first and second external input pins and supplies output signals through said fourth and fifth buffer circuits from said first and second external output pins;
    a test operation mode setting input pin for receiving a mode setting signal for an off-line test;
    a sixth buffer circuit for the input interface, connected to said test operation mode setting input pin;
    a first supply circuit which receives a signal from said second external input pin through said second buffer circuit and supplies the received signal to said random logic circuit;
    a second supply circuit for supplying an output signal of said functional macro circuit to said random logic circuit;
    a first selection circuit which receives the signal from said second external input pin through said second and third buffer circuits and also receives an output signal of said random logic circuit, said first selection circuit operating to select the output signal of said random logic circuit so as to supply the output signal of said random logic circuit to said functional macro circuit, when said mode setting signal indicates a normal operation mode, said first selection circuit also operating to select the signal of said second external input pin and to output the signal of said second external input pin to said functional macro circuit when said mode setting signal indicates a test operation mode;
    a second selection circuit which receives an output signal of said functional macro circuit through a seventh buffer circuit and also receives an output signal of said random logic circuit, said second selection circuit operating to select the output signal of said random logic circuit and to output the output signal of said random logic circuit to said second external output pin through said fifth buffer circuit when said mode setting signal indicates the normal operation mode, said second selection circuit operating to select an output signal of said functional macro circuit and to output the output signal of said functional macro circuit to said second external output pin when the mode setting signal indicates the test operation mode;
    wherein said first supply circuit comprises a first latch circuit for latching an output of said second buffer circuit just before a mode switching to the test operation mode is made valid in accordance with the mode setting signal, and said first latch circuit supplying a latched signal to said random logic circuit, and said second supply circuit comprises a second latch circuit for latching the output signal of said functional macro circuit just before a mode switching to the test operation mode in accordance with the mode setting signal, and said second latch circuit supplying a latched signal to said random logic circuit.

2. A semiconductor integrated logic circuit claimed in claim 1 further including a first external bidirectional pin connected to said random logic circuit through a eighth buffer circuit for an input interface and through a ninth buffer circuit having an enable control for an output interface, and a second external bidirectional pin connected to said random logic circuit through a tenth buffer circuit for an input interface and a eleventh buffer circuit having an enable control for an output interface.

* * * * *